(12) United States Patent
Tai et al.

(10) Patent No.: US 9,176,388 B2
(45) Date of Patent: Nov. 3, 2015

(54) MULTI-LINE WIDTH PATTERN CREATED USING PHOTOLITHOGRAPHY

(71) Applicant: Taiwan Semiconductor Manufacturing Company Limited, Hsinchu (TW)

(72) Inventors: Chun-Liang Tai, Hsinchu (TW);
Bi-Ming Yen, HsinChu (TW);
Chun-Hung Lee, Hsinchu (TW);
De-Fang Chen, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/071,750

(22) Filed: Nov. 5, 2013

(65) Prior Publication Data

US 2015/0125788 A1 May 7, 2015

(51) Int. Cl.
*G03F 7/40* (2006.01)
*G03F 7/20* (2006.01)
*H01L 21/00* (2006.01)

(52) U.S. Cl.
CPC .. *G03F 7/40* (2013.01); *G03F 7/20* (2013.01); *H01L 21/00* (2013.01)

(58) Field of Classification Search
CPC ........................................................ G03F 7/40
See application file for complete search history.

(56) References Cited

U.S. PATENT DOCUMENTS

| | | |
|---|---|---|
| 2002/0132184 A1 | 9/2002 | Babcock |
| 2009/0104541 A1 | 4/2009 | Kim et al. |
| 2009/0144691 A1 | 6/2009 | Rathsack et al. |
| 2013/0165365 A1* | 6/2013 | Matsunaga et al. ........... 510/175 |

* cited by examiner

*Primary Examiner* — Kathleen Duda
(74) *Attorney, Agent, or Firm* — Jones Day

(57) ABSTRACT

Systems and methods are provided for forming features through photolithography. A polymer layer is formed over a substrate. The polymer layer is patterned to form a first feature and a second feature, the first feature and the second feature being separated at a first distance. A rinse material is applied to the polymer layer including the first feature and the second feature. The rinse material is removed from the polymer layer including the first feature and the second feature to cause the first feature and the second feature to come into contact with each other. A third feature is formed based on the first feature and the second feature being in contact with each other.

19 Claims, 6 Drawing Sheets

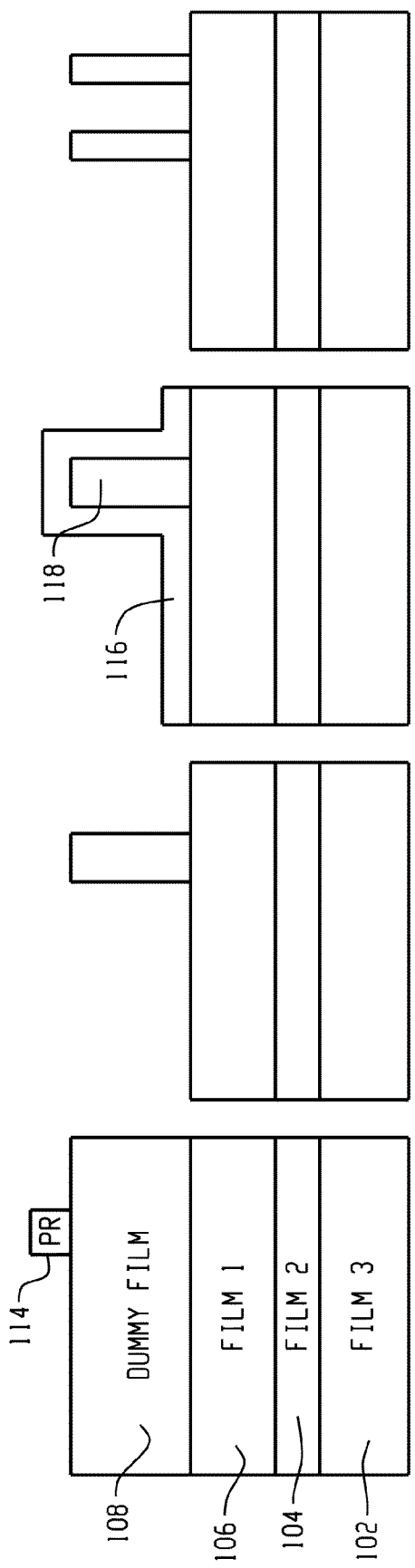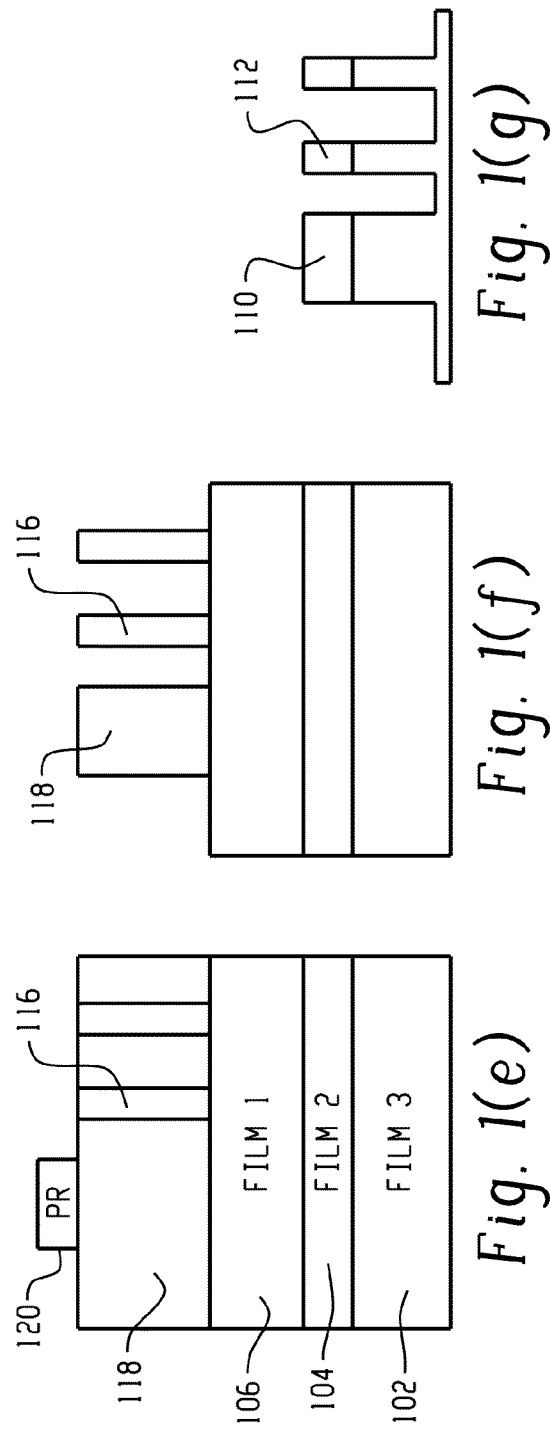

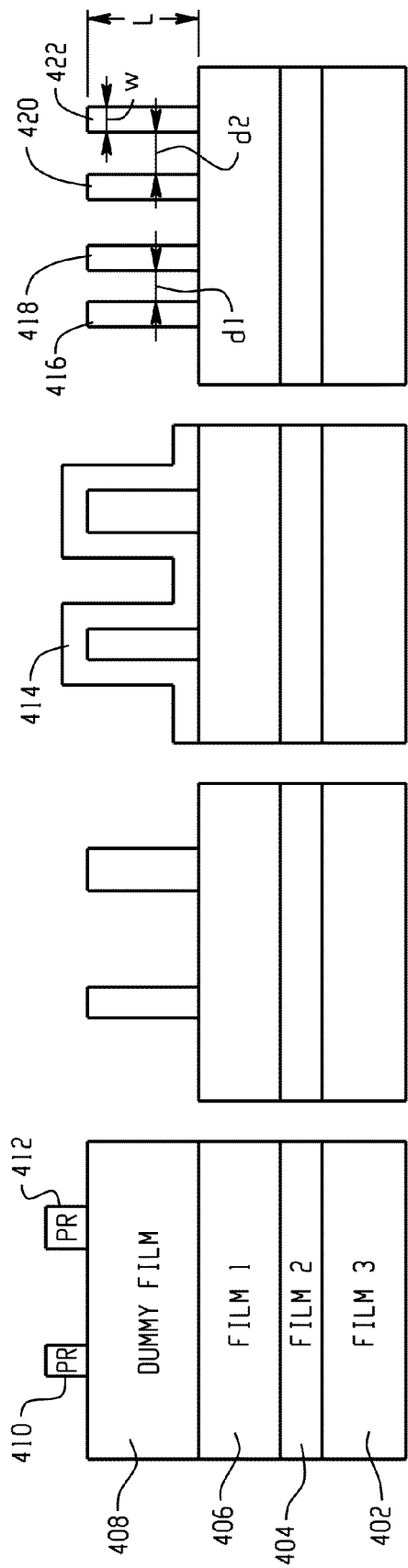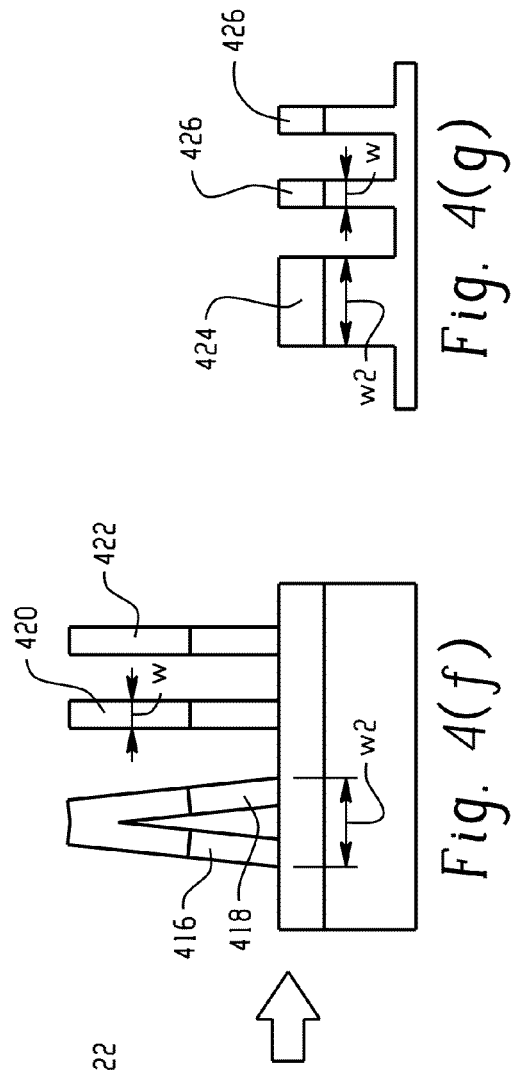

MULTI-LINE WIDTH PATTERN CREATED USING PHOTOLITHOGRAPHY

FIELD

The technology described in this disclosure relates generally to semiconductor devices, and more particularly to semiconductor device fabrication.

BACKGROUND

With the rapid development of integrated circuit fabrication technology, integrated circuit components of different sizes often need to be fabricated on a single wafer. Photolithography that produces a three-dimensional image based on a patterned exposure to light and a subsequent development of a light-sensitive photo-resist on a wafer surface is often used to form certain features of different dimensions for fabricating various integrated circuit components on a single wafer.

SUMMARY

In accordance with the teachings described herein, systems and methods are provided for forming features through photolithography. A polymer layer is formed over a substrate. The polymer layer is patterned to form a first feature and a second feature, the first feature and the second feature being separated at a first distance. A rinse material is applied to the polymer layer including the first feature and the second feature. The rinse material is removed from the polymer layer including the first feature and the second feature to cause the first feature and the second feature to come into contact with each other. A third feature is formed based on the first feature and the second feature being in contact with each other.

In one embodiment, an article includes a substrate, a first feature, and a second feature. The first feature is formed on the substrate, and includes a first top part and a first bottom part. The second feature is formed on the substrate, and includes a second top part and a second bottom part. The second top part is in contact with the first top part. The first bottom part is separated from the second bottom part at a distance. The first feature and the second feature are disposed as a mask to form a third feature.

BRIEF DESCRIPTION OF THE DRAWINGS

FIG. 1(a)-FIG. 1(g) depict example diagrams for forming features with different dimensions on a single substrate.

FIG. 4(a)-FIG. 4(g) depict example diagrams for forming features with different dimensions on a substrate using a single photolithography process.

DETAILED DESCRIPTION

Figure 3:
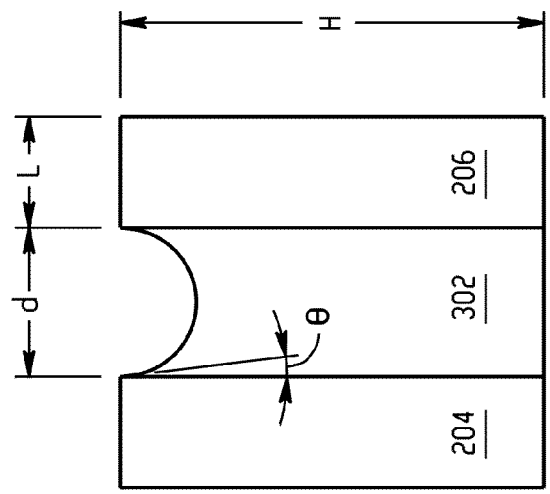
FIG. 3 depicts an example diagram showing a rinse liquid remaining between two features of a photo-resist pattern.

FIG. 1(a)-FIG. 1(g) depict example diagrams for forming features with different dimensions on a single substrate. The substrate includes multiple material layers 102, 104, 106, and 108. Features of different dimensions, such as the features 110 and 122, are formed on the substrate through two photolithography processes (e.g., FIG. 1(a) and FIG. 1(e)).

Specifically, a photo-resist layer 114 is formed on the layer 108 and patterned through a first photolithography process, as shown in FIG. 1(a). The layer 108 is then patterned (e.g., through etching) using the photo-resist layer 114 as a mask and the photo-resist layer 114 is then removed, as shown in FIG. 1(b). A new material layer 116 is deposited on the wafer, as shown in FIG. 1(c). Part of the layer 116 and the remaining layer 108 are then removed, as shown in FIG. 1(d). Thereafter, a coating layer 118 (e.g., an organic film) is deposited on the wafer. Then, another photo-resist layer 120 is formed on the coating layer 118 and patterned through a second photolithography process, as shown in FIG. 1(e). Part of the coating layer 118 is removed (e.g., through etching) using the patterned photo-resist layer 120 as a mask and the photo-resist layer 120 is then removed, as shown in FIG. 1(f). The remaining layer 118 and the remaining layer 116 are used as a mask for producing the features 110 and 112, where the feature 110 has a larger dimension than the feature 112, as shown in FIG. 1(g).

As shown in FIG. 1(a)-FIG. 1(g), multiple photolithography processes are often needed to produce features with different dimensions, which usually increase fabrication costs and complexity.

Figure 2B:
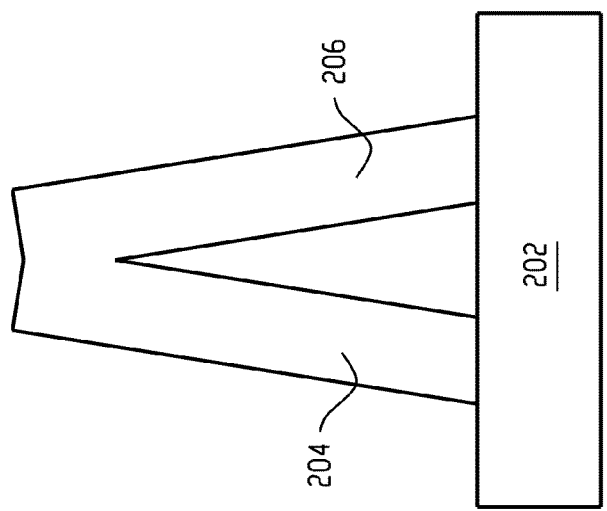
FIG. 2(a)-FIG. 2(b) depict example diagrams showing photo-resist pattern collapse.
Figure 2A:
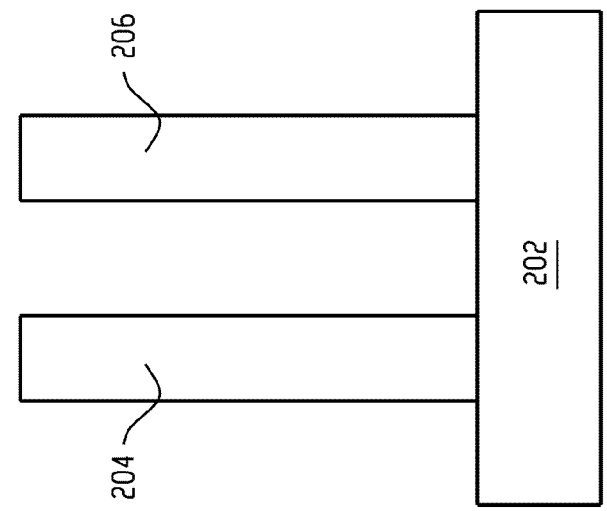

In the present disclosure, photo-resist pattern collapse is implemented to form features of a large dimension together with features of a small dimension in a single photolithography process. FIG. 2(a)-FIG. 2(b) depict example diagrams showing photo-resist pattern collapse. As shown in FIG. 2(a), a photo-resist layer is formed on a substrate 202, and patterned through a photolithography process to form two features 204 and 206 which are separated without touching each other. For example, the photo-resist layer is exposed to light and subject to a developer to form a certain pattern including features 204 and 206. The patterned photo-resist layer is rinsed using a rinse liquid (e.g., water) and then the rinse liquid is dried off. During the drying process, the photo-resist pattern collapse occurs. As shown in FIG. 2(b), the top parts of the features 204 and 206 come into contact. In some embodiments, the source of the photo-resist pattern collapse is the surface tension of the rinse liquid.

FIG. 3 depicts an example diagram showing a rinse liquid remaining between two features 204 and 206 of the photo-resist pattern. As shown in FIG. 3, the rinse liquid 302 remains between the features 204 and 206 before the drying process. The surface of the rinse liquid 302 is concave, and a negative pressure in the rinse liquid is produced. A capillary force that pulls the features 204 and 206 together is related to the negative pressure and an aspect ratio of the photo-resist pattern:

$$F = P \times A \qquad (1)$$

where F represents the capillary force, P represents the negative pressure in the rinse liquid, and A represents the aspect ratio of the photo-resist pattern. For example, the aspect ratio A of the photo-resist pattern is equal to the height of the features 204 and 206 (e.g., H) divided by the width of the features 204 and 206 (e.g., L). The negative pressure P is related to the distance between the features 204 and 206 (e.g., d). The smaller the distance between the features 204 and 206 becomes, the larger the capillary force F is generated. When the distance between the features 204 and 206 becomes smaller than a predetermined distance threshold, the capillary force F becomes large enough to cause the features 204 and 206 to come into contact. That is, the photo-resist pattern collapse occurs.

FIG. 4(*a*)-FIG. 4(*g*) depict example diagrams for forming features with different dimensions on a substrate using a single photolithography process. The substrate includes multiple layers 402, 404, 406 and 408. A photo-resist layer (e.g., containing one or more polymer materials) is formed on the layer 408. The wafer is then heated or baked (e.g., at a temperature ranging from about 90° C. to about 150° C.) for a short time period (e.g., several seconds) to densify the photo-resist and to evaporate solvents. The photo-resist layer is then exposed to light of a predetermined wavelength through patterns of a mask. The mask patterns are thus transferred to the photo-resist. The exposed photo-resist is then heated or baked (e.g., at a temperature ranging from about 70° C. to about 150° C.) for a certain time period (e.g., several minutes). A developer is then applied to the photo-resist to remove part of the photo-resist layer. A patterned photo-resist layer including two photo-resist features 410 and 412 is then formed, as shown in FIG. 4(*a*).

The layer 408 (e.g., polysilicon) is then patterned (e.g., through etching) using the patterned photo-resist layer including the photo-resist features 410 and 412 as a mask, and the photo-resist layer is then removed, as shown in FIG. 4(*b*). A new material layer 414 (e.g., silicon nitride) is deposited on the wafer, as shown in FIG. 4(*c*). Part of the layer 414 and the remaining layer 408 are then removed (e.g., through etching) to form features 416, 418, 420 and 422, as shown in FIG. 4(*d*). For example, the features 416 and 418 are separated at a distance d1, and the features 420 and 422 are separated at a distance d2, where d2 is larger than d1. In some embodiments, the features 416, 418, 420 and 422 have approximately a same height (e.g., L) and a same width (e.g., w). In certain embodiments, the features 416, 418, 420 and 422 have different heights and different widths.

As an example, if the distance d1 between the features 416 and 418 is smaller than a distance threshold (e.g., 25 nm), the photo-resist pattern collapse occurs. In another example, if an aspect ratio associated with the height (e.g., L) and the width (e.g., w) of the features 416 and 418 is larger than a predetermined aspect-ratio threshold (e.g., 10), the photo-resist pattern collapse occurs. The aspect ratio of the features 416 and 418 is smaller than a maximum aspect ratio.

In some embodiments, part of the layer 406 (e.g., oxides) is removed (e.g., through etching) using the remaining layer 414 that includes the features 416, 418, 420 and 422 as a mask, as shown in FIG. 4(*e*). For example, the aspect ratio of the features 416 and 418 is increased as a result of removing part of the layer 406. The photo-resist pattern collapse occurs and the features 416 and 418 come into contact with each other, as shown in FIG. 4(*f*). Because the distance d2 between the features 420 and 422 is larger than the distance d1, the features 420 and 422 do not collapse to come into contact with each other. For example, the layer 406 has a thickness larger than 50 nm, and is fabricated during a front-end-of-line process or a back-end-of-line process.

The collapsed features 416 and 418, together with the features 420 and 422, are used as a mask to produce final features 424 and 426, where the feature 424 has a width (e.g., w2) much larger than that of the features 426 (e.g., w). For example, the width w2 is approximately equal to a sum of the width of the feature 416 (e.g., w), the distance d1, and the width of the feature 418 (e.g., w). In some embodiments, if a mask has an open ratio in a range of about 1% to about 10%, the photo-resist pattern collapse can be implemented to generate features with different dimensions as described above.

Figure 5A:
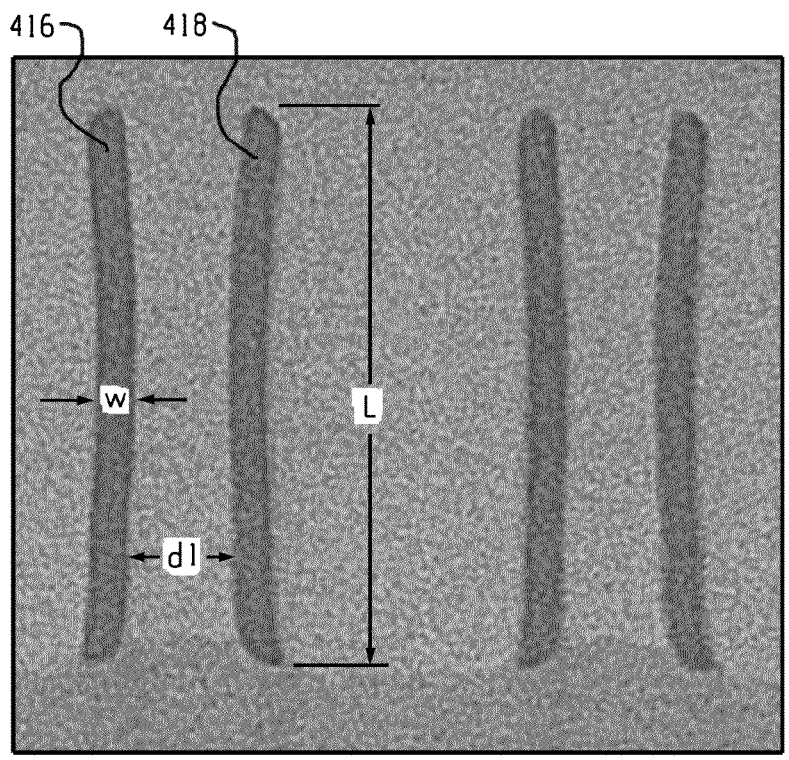
FIG. 5(a)-FIG. 5(b) depict example diagrams showing side views of certain features.
Figure 5B:
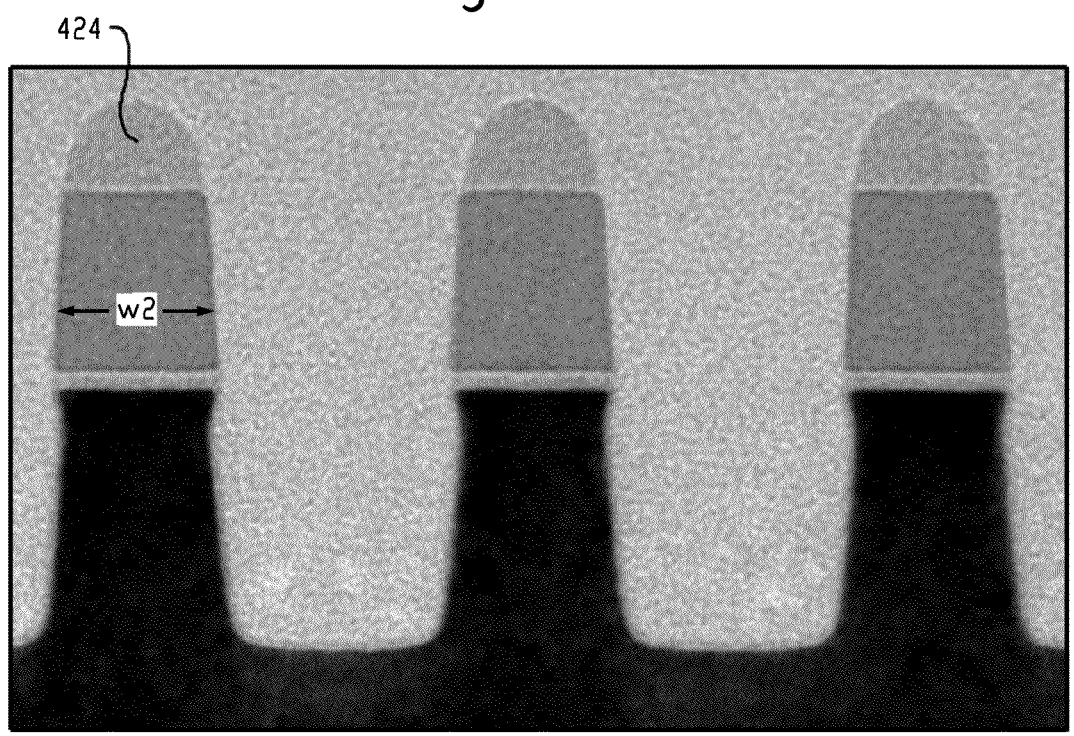

FIG. 5(*a*) depicts an example diagram showing a side view of the features 416 and 418, FIG. 5(*b*) depicts an example diagram showing a side view of the final feature 424. As shown in FIG. 5(*a*), the features 416 and 418 are separated at a distance (e.g., d1), and the features 416 and 418 have approximately a same height (e.g., L) and a same width (e.g., w). As shown in FIG. 5(*b*), the feature 424 has a width (e.g., w2) approximately equal to a sum of the width of the feature 416 (e.g., w), the distance d1, and the width of the feature 418 (e.g., w).

Figure 6A:
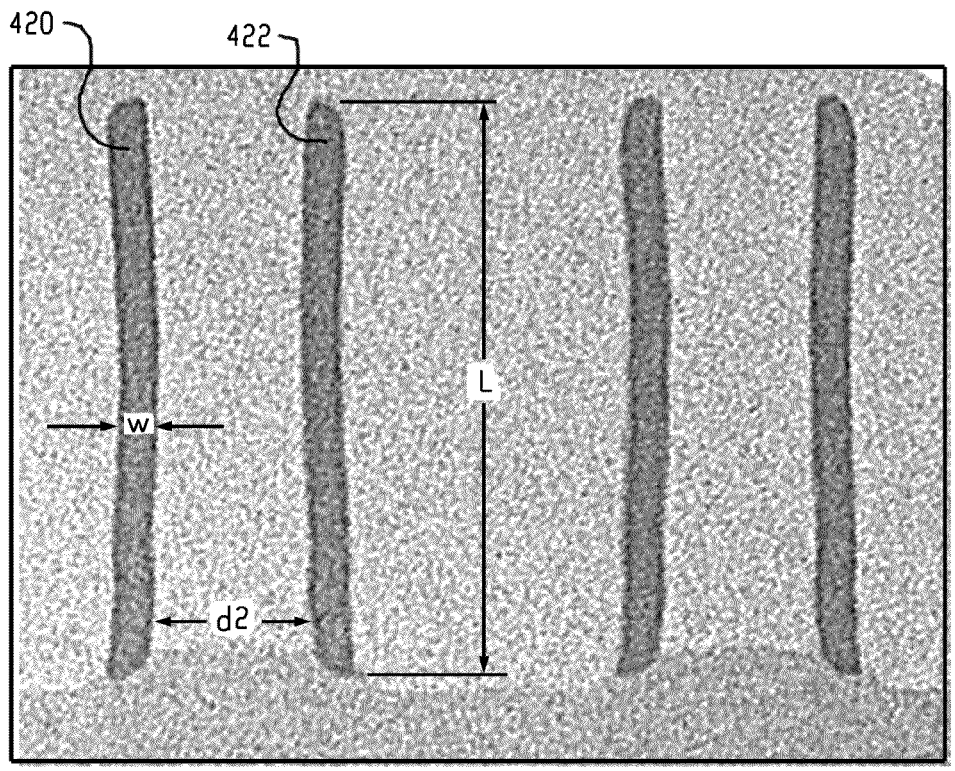
FIG. 6(a)-FIG. 6(b) depict example diagrams showing side views of some features.
Figure 6B:
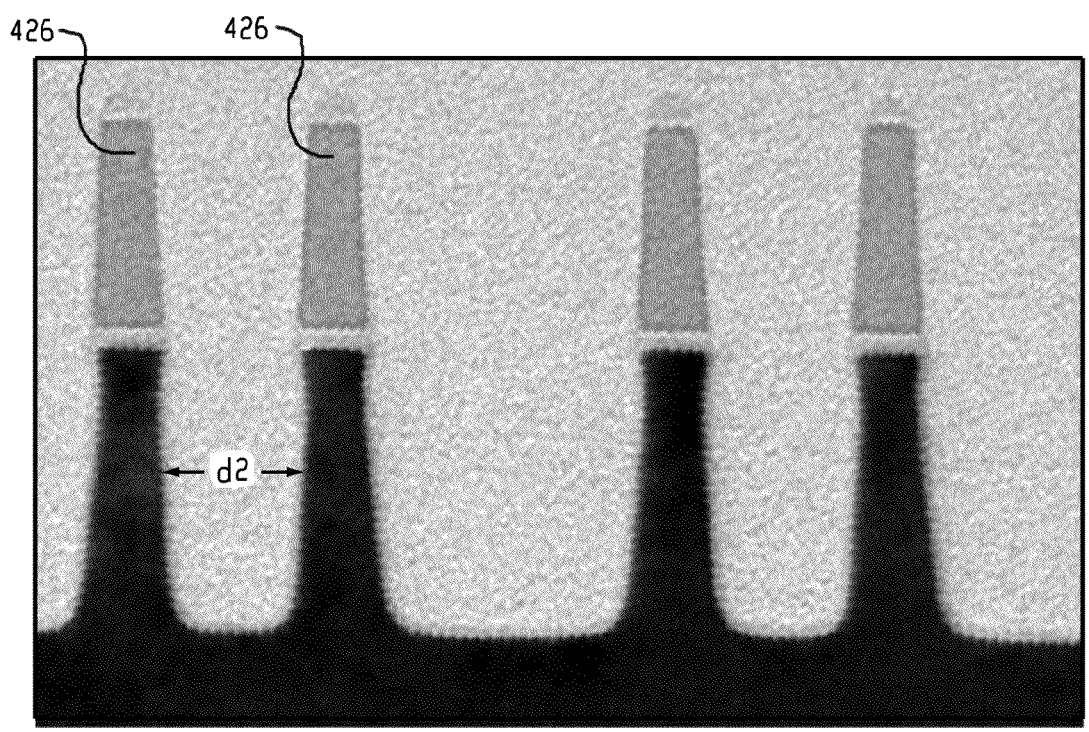

FIG. 6(*a*) depicts an example diagram showing a side view of the features 420 and 422, FIG. 6(*b*) depicts an example diagram showing a side view of the final features 426. As shown in FIG. 6(*a*), the features 420 and 422 are separated at a distance (e.g., d2), and the features 420 and 422 have approximately a same height (e.g., L) and a same width (e.g., w). As shown in FIG. 6(*b*), the features 426 are separated at a distance (e.g., d2).

Figure 7:
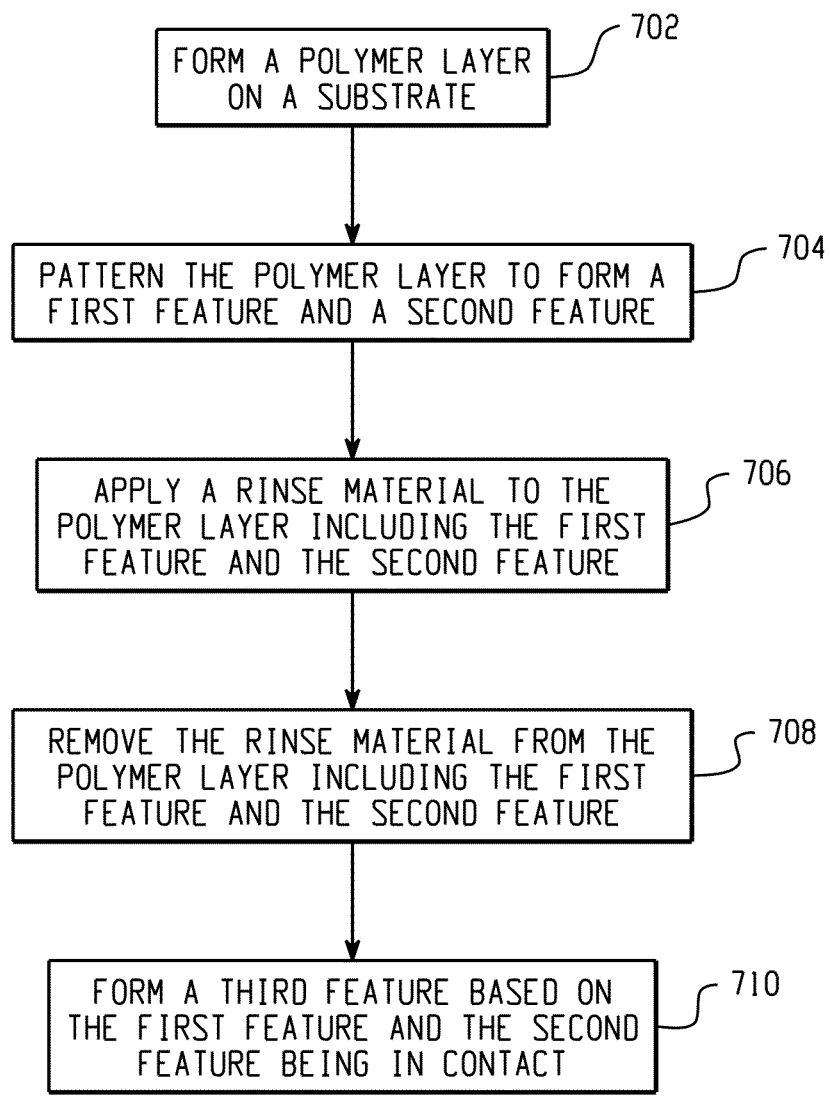
FIG. 7 depicts an example flow chart for forming features through photolithography.

FIG. 7 depicts an example flow chart for forming features through photolithography. At 702, a polymer layer (e.g., photo-resist) is formed on a substrate. At 704, the polymer layer is patterned to form a first feature and a second feature, the first feature and the second feature being separated at a first distance. At 706, a rinse material (e.g., water) is applied to the polymer layer including the first feature and the second feature. At 708, the rinse material is removed from the polymer layer including the first feature and the second feature to cause the first feature and the second feature to come into contact with each other. At 710, a third feature is formed based on the first feature and the second feature being in contact with each other.

In one embodiment, a method is provided for forming features through photolithography. A polymer layer is formed over a substrate. The polymer layer is patterned to form a first feature and a second feature, the first feature and the second feature being separated at a first distance. A rinse material is applied to the polymer layer including the first feature and the second feature. The rinse material is removed from the polymer layer including the first feature and the second feature to cause the first feature and the second feature to come into contact with each other. A third feature is formed based on the first feature and the second feature being in contact with each other.

In another embodiment, an article includes a substrate, a first feature, and a second feature. The first feature is formed on the substrate, and includes a first top part and a first bottom part. The second feature is formed on the substrate, and includes a second top part and a second bottom part. The second top part is in contact with the first top part. The first bottom part is separated from the second bottom part at a distance. The first feature and the second feature are disposed as a mask to form a third feature.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Further, persons of ordinary skill in the art will recognize various equivalent combinations and substitutions for various components shown in the figures.

Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. The present disclosure may repeat reference numerals and/or letters in the various examples, and this repetition is for the purpose of simplicity and clarity and does not in itself dictate a relationship between the various embodiments and/or configurations discussed. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as on, etc. that are used for descriptive purposes only and are not to be construed as limiting. The embodiments of a device or article described herein can be manufactured, used, or shipped in a number of positions and orientations. For example, the term "on" as used herein (including in the claims) may not necessarily indicate that a first layer/structure "on" a second layer/structure is directly on or over and in immediate contact with the second layer/structure unless such is specifically stated; there may be one or more third layers/structures between the first layer/structure and the second layer/structure. The term "substrate" used herein (including in the claims) may refer to any construction comprising one or more materials, including, but not limited to, bulk materials such as a wafer (either alone or in assemblies comprising other materials thereon), and one or more material layers (either alone or in assemblies comprising other materials).

What is claimed is:

1. A method comprising:
    forming a polymer layer over a substrate;
    patterning the polymer layer to form a first feature and a second feature, the first feature and the second feature being separated at a first distance;
    applying a rinse material to the polymer layer including the first feature and the second feature;
    removing the rinse material from the polymer layer including the first feature and the second feature to cause the first feature and the second feature to come into contact with each other; and
    forming a third feature based on the first feature and the second feature being in contact with each other,
    wherein the first feature is associated with a first height and a first width, and the second feature is associated with a second height and a second width,
    wherein the forming the third feature based on the first feature and the second feature being in contact with each other comprises etching into the substrate using the first feature and second feature in contact as a mask to form the third feature, the third feature being associated with a third height and a third width,
    wherein the third width is approximately equal to a sum of the first width, the first distance and the second width.

2. The method of claim 1, wherein the patterning the polymer layer to form the first feature and the second feature includes:
    exposing part of the polymer layer to light; and
    developing the polymer layer to remove the part of the polymer for forming the first feature and the second feature.

3. The method of claim 2, wherein the patterning the polymer layer to form the first feature and the second feature further includes:
    etching into the substrate using the developed polymer layer as a mask to form the first feature and the second feature.

4. The method of claim 3, wherein a first layer included in the substrate is etched through to form the first feature and the second feature.

5. The method of claim 1, wherein:
    the first feature includes a first top part and a first bottom part;
    the second feature includes a second top part and a second bottom part; and
    the first bottom part is separated from the second bottom part at the first distance.

6. The method of claim 5, wherein:
    the rinse material includes a rinse liquid; and
    the second top part comes into contact with the first top part upon removal of the rinse material.

7. The method of claim 1, wherein:
    the first height is approximately equal to the second height; and
    the first width is approximately equal to the second width.

8. The method of claim 1, wherein a second layer included in the substrate is etched through to form the third feature.

9. The method of claim 1, wherein an aspect ratio that is equal to the first height divided by the first width is larger than a predetermined aspect-ratio threshold.

10. The method of claim 9, wherein the predetermined aspect-ratio threshold is 10.

11. The method of claim 1, further comprising patterning the polymer layer to form a fourth feature and a fifth feature, the fourth feature and the fifth feature being separated at a second distance larger than the first distance.

12. The method of claim 11, wherein the fourth feature and the fifth feature do not come into contact upon removal of the rinse material.

13. The method of claim 1, wherein the first distance is smaller than a distance threshold.

14. The method of claim 13, wherein the distance threshold is 25 nm.

15. The method of claim 1, wherein the polymer layer includes photo-resist.

16. A method comprising:
    forming a photoresist layer over a substrate;
    patterning the photoresist layer to form a first feature and a second feature, the first feature and the second feature being separated at a first distance;
    applying a rinse material to the photoresist layer including the first feature and the second feature;
    removing the rinse material from the photoresist layer including the first feature and the second feature to cause the first feature and the second feature to come into contact with each other; and
    forming a third feature based on the first feature and the second feature being in contact with each other,
    wherein the first feature is associated with a first height and a first width, and the second feature is associated with a second height and a second width, wherein the forming the third feature based on the first feature and the second feature being in contact with each other includes etching into the substrate using the first feature and second feature in contact as a mask to form the third feature, the third feature being associated with a third height and a third width, wherein the third width is approximately equal to a sum of the first width, the first distance and the second width.

17. The method of claim 16, wherein the patterning the photoresist layer to form the first feature and the second feature includes:

exposing part of the photoresist layer to light; and developing the photoresist layer to remove the part of the polymer for forming the first feature and the second feature.

18. The method of claim 17, wherein the patterning the photoresist layer to form the first feature and the second feature further includes:

etching into the substrate using the developed photoresist layer as a mask to form the first feature and the second feature.

19. A method comprising:

forming a polymer layer over a substrate;

patterning the polymer layer to form a first feature and a second feature, the first feature and the second feature being separated at a first distance;

applying a rinse material to the polymer layer including the first feature and the second feature;

removing the rinse material from the polymer layer including the first feature and the second feature to cause the first feature and the second feature to come into contact with each other; and forming a third feature based on the first feature and the second feature being in contact with each other, wherein the patterning the polymer layer to form the first feature and the second feature includes: patterning the polymer layer to form a fourth feature and a fifth feature, the fourth feature and the fifth feature being separated at a second distance larger than the first distance.

\* \* \* \* \*